United States Patent
Ogasawara et al.

(10) Patent No.: US 11,367,590 B2
(45) Date of Patent: Jun. 21, 2022

(54) PLASMA PROCESSING METHOD AND PLASMA PROCESSING APPARATUS

(71) Applicant: TOKYO ELECTRON LIMITED, Tokyo (JP)

(72) Inventors: Kosuke Ogasawara, Miyagi (JP); Kentaro Yamaguchi, Miyagi (JP); Takanori Banse, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/975,462

(22) PCT Filed: Jul. 25, 2019

(86) PCT No.: PCT/JP2019/029298
§ 371 (c)(1),
(2) Date: Aug. 25, 2020

(87) PCT Pub. No.: WO2020/031731
PCT Pub. Date: Feb. 13, 2020

(65) Prior Publication Data
US 2021/0020409 A1 Jan. 21, 2021

(30) Foreign Application Priority Data
Aug. 8, 2018 (JP) .............................. JP2018-149256

(51) Int. Cl.
*H01L 21/67* (2006.01)
*H01L 21/311* (2006.01)
*H01J 37/32* (2006.01)

(52) U.S. Cl.
CPC .. *H01J 37/32091* (2013.01); *H01J 37/32422* (2013.01); *H01J 37/32449* (2013.01);
(Continued)

(58) Field of Classification Search
None
See application file for complete search history.

(56) References Cited

U.S. PATENT DOCUMENTS 6,107,192 A * 8/2000 Subrahmanyan ........................... H01L 21/02063
438/637
2009/0321247 A1* 12/2009 Cerio, Jr ................ C23C 14/025
204/192.11
(Continued)

FOREIGN PATENT DOCUMENTS

JP 2014-082228 A 5/2014
JP 2017-183688 A 10/2017
(Continued)

OTHER PUBLICATIONS

International Search Report issued for PCT Application No. PCT/JP2019/029298 dated Oct. 29, 2019, 4 pages.

*Primary Examiner* — Shamim Ahmed
(74) *Attorney, Agent, or Firm* — Weihrouch IP

(57) ABSTRACT

A plasma processing method includes: placing a substrate on a substrate support provided in a chamber of a capacitively coupled plasma processing apparatus where the substrate includes a silicon-containing film and a mask provided on the silicon-containing film and having an opening having a longitudinal direction; and supplying an inert gas into the chamber; and selectively performing one of supplying a first radio-frequency power to an upper electrode of the plasma processing apparatus to generate plasma from the inert gas and supplying a second radio-frequency power to a lower electrode of the plasma processing apparatus included in the substrate support, and applying a negative bias voltage to the upper electrode to cause positive ions from the plasma to collide with the upper electrode and release a silicon- (Continued)

containing material from the upper electrode, thereby depositing the silicon-containing material on the substrate.

17 Claims, 12 Drawing Sheets

(52) U.S. Cl.
CPC .. *H01L 21/31116* (2013.01); *H01L 21/31138* (2013.01); *H01L 21/31144* (2013.01); *H01L 21/67069* (2013.01); *H01J 2237/334* (2013.01)

(56) References Cited

U.S. PATENT DOCUMENTS

| | | | |
|---|---|---|---|
| 2014/0235061 A1* | 8/2014 | Stumpf | B23B 1/00 438/710 |
| 2015/0340243 A1 | 11/2015 | Kikuchi | |
| 2017/0311430 A1* | 10/2017 | Liang | H01J 37/32834 |
| 2017/0345666 A1 | 11/2017 | Morikita et al. | |
| 2019/0131141 A1 | 5/2019 | Kihara et al. | |

FOREIGN PATENT DOCUMENTS

| | | |
|---|---|---|
| JP | 2017-212357 A | 11/2017 |
| JP | 2018-093189 A | 6/2018 |

\* cited by examiner

PLASMA PROCESSING METHOD AND PLASMA PROCESSING APPARATUS

CROSS REFERENCE TO RELATED APPLICATION

This application is a 35 U.S.C. 371 National Phase Entry Application from PCT/JP2019/029298, filed Jul. 25, 2019, which claims priority to Japanese Patent Application No. 2018-149256, filed Aug. 8, 2018, the disclosures of which are incorporated herein in their entirety by reference, and priority is claimed to each of the foregoing.

TECHNICAL FIELD

The present disclosure relates to a plasma processing method and a plasma processing apparatus.

BACKGROUND

In manufacturing electronic devices, a plasma etching is performed. In a plasma etching, a mask pattern is transferred to a base film. An opening is formed in the mask. The width of the mask opening may be reduced before the plasma etching is performed.

Patent Documents 1 and 2 describe techniques for reducing the width of the mask opening. In the techniques described in Patent Documents 1 and 2, a capacitively coupled plasma processing apparatus is used. A plasma is generated in a chamber of the plasma processing apparatus. A negative DC voltage is applied to an upper electrode of the plasma processing apparatus to cause ions from the plasma to collide with the upper electrode of the plasma processing apparatus. Due to the collision of ions, silicon particles are emitted from the upper electrode. The emitted particles are deposited on a substrate. As a result, the width of the mask opening is reduced.

PRIOR ART DOCUMENT

Patent Document

Patent Document 1: Japanese Patent Laid-Open Publication No. 2014-082228
Patent Document 2: Japanese Patent Laid-Open Publication No. 2018-093189

SUMMARY OF THE INVENTION

Problems to be Solved

It is required to selectively reduce one of the width in a longitudinal direction of a mask opening and the width in the direction orthogonal to a longitudinal direction of the opening.

Means to Solve the Problems

In an embodiment, a plasma processing method performed on a substrate is provided. The substrate has a silicon-containing film and a mask. The mask is provided on the silicon-containing film. An opening is formed in the mask. The opening has a longitudinal direction. The plasma processing method is executed in a state where the substrate is placed on a substrate support of a capacitively coupled plasma processing apparatus. The substrate support is provided inside a chamber of the plasma processing apparatus. The plasma processing method includes a step of supplying an inert gas into the chamber. The plasma processing method further includes a step of depositing a silicon-containing material on the substrate. In the step of depositing, to generate plasma from the inert gas, one of supplying a first radio-frequency power from a first radio-frequency power supply to an upper electrode of the plasma processing apparatus and supplying a second radio-frequency power from a second radio-frequency power supply to a lower electrode of the substrate support is selectively performed. The second radio-frequency power has a frequency lower than a frequency of the first radio-frequency power. Further, in the step of depositing, a negative bias voltage is applied to the upper electrode to cause positive ions from the plasma to collide with the upper electrode to release the silicon-containing material from the upper electrode.

Effect of the Invention

According to an embodiment, it becomes possible to selectively reduce one of the width in the longitudinal direction of the mask opening and the width in the direction orthogonal to the longitudinal direction of the opening.

DETAILED DESCRIPTION TO EXECUTE THE INVENTION

Figure 1:
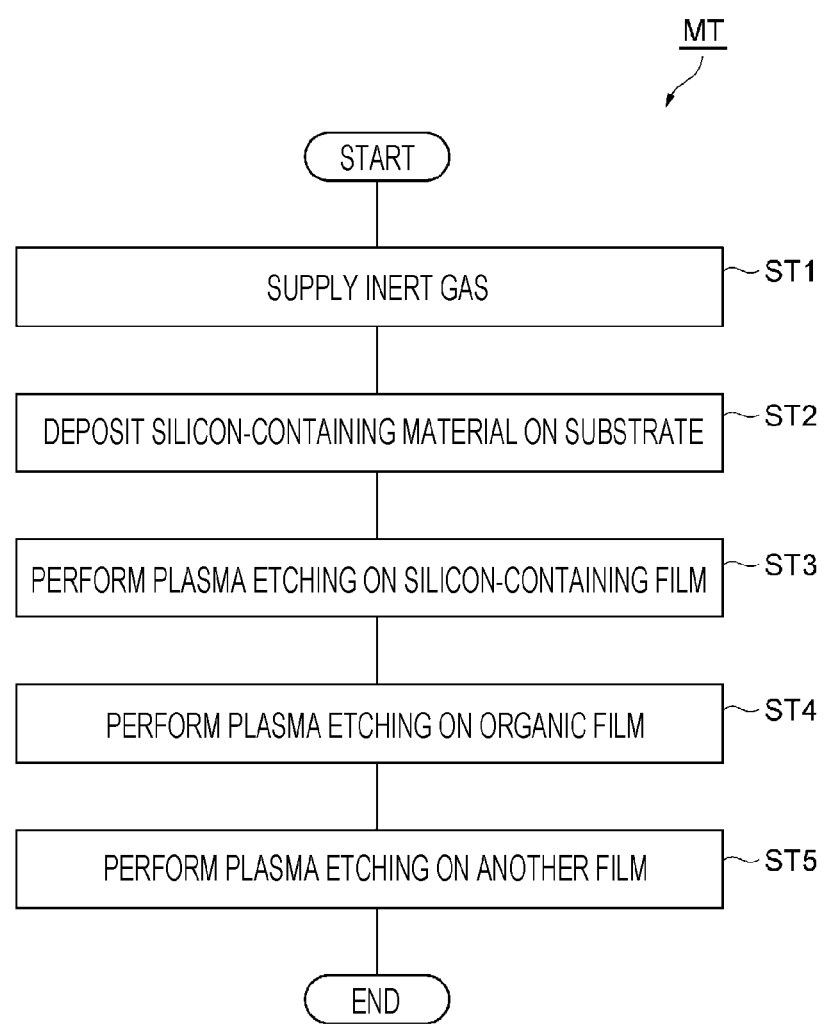
FIG. 1 is a flowchart illustrating a plasma processing method according to an embodiment.

Various embodiments will be described below.

In an embodiment, a plasma processing method performed on a substrate is provided. The substrate has a silicon-containing film and a mask. The mask is provided on the silicon-containing film. An opening is formed in the mask. The opening has a longitudinal direction. The plasma processing method is executed in a state where the substrate is placed on a substrate support of a capacitively coupled plasma processing apparatus. The substrate support is provided inside a chamber of the plasma processing apparatus. The plasma processing method includes a step of supplying an inert gas into the chamber. The plasma processing method further includes a step of depositing a silicon-containing material on the substrate. In the step of depositing, to generate plasma from the inert gas, one of supplying a first radio-frequency power from a first radio-frequency power supply to an upper electrode of the plasma processing apparatus and supplying a second radio-frequency power from a second radio-frequency power supply to a lower electrode of the substrate support is selectively performed. The second radio-frequency power has a frequency lower than a frequency of the first radio-frequency power. Further, in the step of depositing, a negative bias voltage is applied to the upper electrode to cause positive ions from the plasma to collide with the upper electrode to release the silicon-containing material from the upper electrode.

In the step of depositing, when a negative bias voltage is applied to the upper electrode in a state where the first radio-frequency power is being supplied to the upper electrode, the width of the mask opening in the longitudinal direction is selectively reduced by the silicon-containing material. Meanwhile, in the step of depositing, when a negative bias voltage is applied to the upper electrode in a state where the second radio-frequency power is being supplied to the lower electrode, the width of the mask opening in the longitudinal direction is selectively reduced by the silicon-containing material.

In another embodiment, a plasma processing method performed on a substrate is provided. The substrate has a silicon-containing film and a mask. The mask is provided on the silicon-containing film. An opening is formed in the mask. The opening has a longitudinal direction. The plasma processing method is executed in a state where the substrate is placed on a substrate support of a capacitively coupled plasma processing apparatus. The plasma processing method includes a step of supplying an inert gas into the chamber. The plasma processing method further includes a step of depositing a silicon-containing material on the substrate. In the step of depositing, the second radio-frequency power is supplied from the second radio-frequency power supply to the lower electrode of the substrate support to generate plasma from the inert gas. The second radio-frequency power has a frequency lower than the frequency of the first radio-frequency power generated by the first radio-frequency power supply electrically connected to the upper electrode of the plasma processing apparatus. Further, in the step of depositing, a negative bias voltage is applied to the upper electrode to cause positive ions from the plasma to collide with the upper electrode to release the silicon-containing material from the upper electrode.

In the plasma processing method according to another embodiment, as described above, the negative bias voltage is applied to the upper electrode in a state where the second radio-frequency power is supplied to the lower electrode. As a result, the width of the opening of the mask in the direction orthogonal to the longitudinal direction is selectively reduced by the silicon-containing material.

In an embodiment, the negative bias voltage may be a DC voltage.

In the embodiment, the silicon-containing material that constitutes the upper electrode may be comprised of silicon.

In the embodiment, the mask may be a resist mask. The silicon-containing film may be an anti-reflection film containing silicon. The substrate may further have an organic film on which an anti-reflection film is provided.

In the embodiment, the plasma processing method may further include performing a plasma etching on the base film of the mask after the depositing step.

In the embodiment, at least from the start of the step of depositing to the end of the step of performing the plasma etching, the substrate may be continuously contained in the internal space of the depressurized chamber.

In another embodiment, a capacitively coupled plasma processing apparatus is provided. The plasma processing apparatus includes a chamber, a gas supply, a substrate support, an upper electrode, a first radio-frequency power supply, a second radio-frequency power supply, a bias voltage power, and a controller. The gas supply is configured to supply an inert gas into the chamber. The substrate support has a lower electrode and is provided in the chamber. The upper electrode is provided above the substrate support. The first radio-frequency power supply is configured to generate the first radio-frequency power and is electrically connected to the upper electrode. The second radio-frequency power supply is configured to generate the second radio-frequency power and is electrically connected to the lower electrode. The second radio-frequency power has a frequency lower than a frequency of the first radio-frequency power. A bias power supply is configured to apply a negative bias voltage to the upper electrode. The controller is configured to control the gas supply, the first radio-frequency power supply, the second radio-frequency power supply, and the bias power supply. The controller controls the gas supply to supply an inert gas into the chamber. In order to generate plasma from the inert gas, the controller selectively performs one of supplying the first radio-frequency power from the first radio-frequency power supply to the upper electrode and supplying the second radio-frequency power from the second radio-frequency power supply to the lower electrode. The controller controls the bias power supply to apply a negative bias voltage to the upper electrode to cause positive ions from the plasma to collide with the upper electrode and release the silicon-containing material from the upper electrode.

In the embodiment, the bias power supply may be a DC power supply.

In the embodiment, the silicon-containing material that constitutes the upper electrode may be comprised of silicon.

Various exemplary embodiments will now be described in detail with reference to the drawings. In the respective drawings, the same or corresponding parts will be denoted by the same symbols.

FIG. 1 is a flowchart illustrating a plasma processing method according to an embodiment. The plasma processing method illustrated in FIG. 1 (hereinafter, referred to as a "method MT") is performed to reduce the width of the mask opening of the substrate.

Figure 2A:
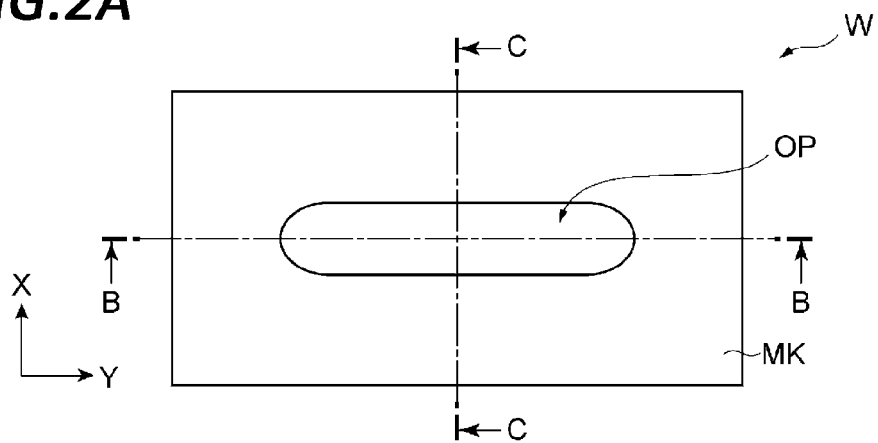
FIG. 2A is a plan view illustrating a part of an example substrate.
Figure 2B:
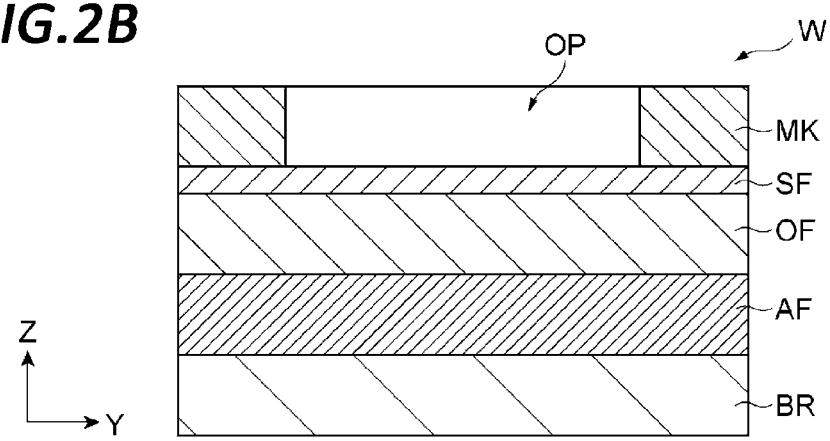
FIG. 2B is a cross-sectional view taken along line B-B of FIG. 2A.
Figure 2C:
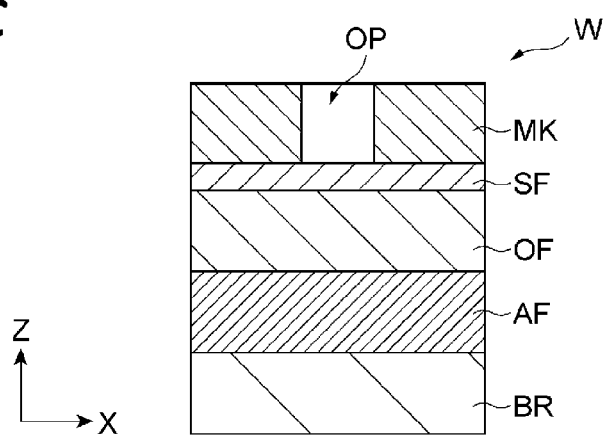
FIG. 2C is a cross-sectional view taken along line C-C of FIG. 2A.

FIG. 2A is a plan view illustrating a part of an example substrate, FIG. 2B is a cross-sectional view taken along line B-B of FIG. 2A, and FIG. 2C is a cross-sectional view taken along line C-C of FIG. 2A. The method MT is applicable to the substrate W illustrated in FIGS. 2A, 2B, and 2C. The substrate W has a silicon-containing film SF and a mask MK. The silicon-containing film SF is formed of a silicon-containing material. The silicon-containing film SF may be, for example, an anti-reflection film containing silicon. The mask MK is provided on the silicon-containing film SF. The mask MK is, for example, a resist mask. The mask MK may be formed of any material when the material is selected such that the silicon-containing film SF is selectively etched with respect to the mask MK. An opening OP is formed in the mask MK. The opening OP has a longitudinal direction. The opening OP is, for example, a long hole. Hereinafter, the longitudinal direction of the opening OP is referred to as the Y direction, and the direction orthogonal to the longitudinal direction of the opening OP is referred to as the X direction. The mask MK is patterned by, for example, a photolithography technique.

The substrate W may further include an organic film OF. The silicon-containing film SF is provided on the organic film OF. The substrate W may further include a base region BR and another film AF. The film AF is provided on the base region BR. The film AF may be a silicon-containing film. The film AF is, for example, a silicon oxide film. The organic film OF is provided on the film AF.

Figure 3:
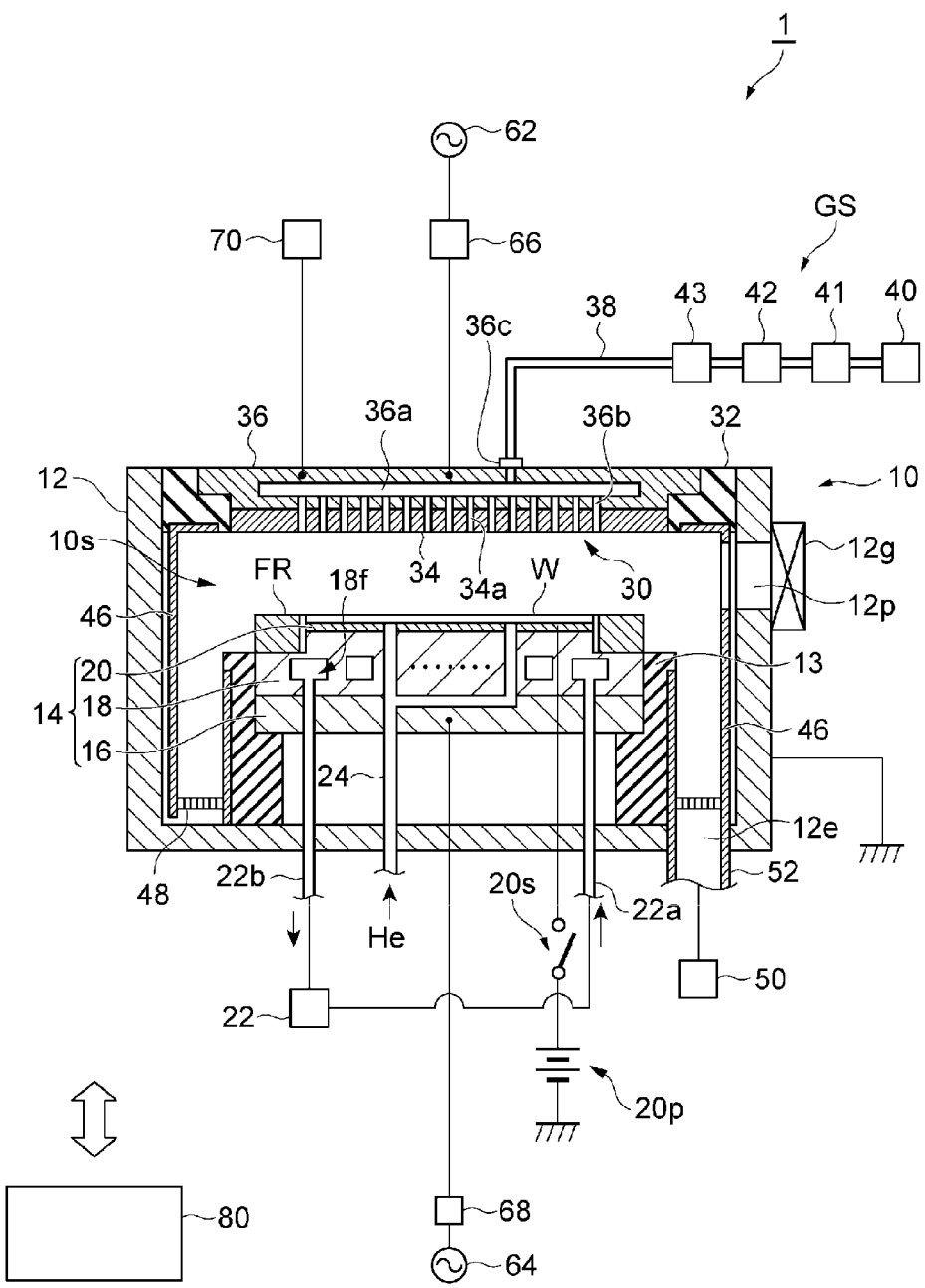
FIG. 3 is a view schematically illustrating a plasma processing apparatus according to the embodiment.

A plasma processing apparatus is used to perform the method MT. FIG. 3 is a view schematically illustrating a plasma processing apparatus according to the embodiment. The plasma processing apparatus 1 illustrated in FIG. 3 is a capacitively coupled plasma processing apparatus. The plasma processing apparatus 1 includes a chamber 10. The chamber 10 provides an internal space 10s therein.

The chamber 10 includes a chamber body 12. The chamber body 12 has a substantially cylindrical shape. The internal space 10s is provided inside the chamber body 12. The chamber body 12 is made of, for example, aluminum. A film having corrosion resistance is provided on the inner wall surface of the chamber body 12. The film having corrosion resistance may be a film formed of a ceramic such as aluminum oxide or yttrium oxide.

A passage 12p is formed in the side wall of the chamber body 12. A substrate W passes through the passage 12p when being transferred between the internal space 10s and the outside of the chamber 10. The passage 12p may be opened and closed by a gate valve 12g. The gate valve 12g is provided along the side wall of the chamber body 12.

A support portion 13 is provided on the bottom of the chamber body 12. The support portion 13 is formed of an insulating material. The support portion 13 has a substantially cylindrical shape. The support portion 13 extends upward from the bottom of the chamber body 12 in the internal space 10s. The support portion 13 supports a substrate support, that is, a support 14. The support 14 is provided in the chamber 10, that is, in the internal space 10s. The support 14 is configured to support the substrate W in the internal space 10s.

The support 14 includes a lower electrode 18 and an electrostatic chuck 20. The support 14 may further include an electrode plate 16. The electrode plate 16 is formed of a conductive material such as, for example, aluminum and has a substantially disk shape. The lower electrode 18 is provided on the electrode plate 16. The electrode plate 18 is formed of a conductive material such as, for example, aluminum and has a substantially disk shape. The lower electrode 18 is electrically connected to the electrode plate 16.

The electrostatic chuck 20 is provided on the lower electrode 18. The substrate W is placed on the upper surface of the electrostatic chuck 20. The electrostatic chuck 20 has a main body and electrodes. The body of the electrostatic chuck 20 is made of a dielectric material. The electrode of the electrostatic chuck 20 is a film-shaped electrode and is provided inside the main body of the electrostatic chuck 20. The electrode of the electrostatic chuck 20 is connected to a DC power supply 20p via a switch 20s. When a voltage from the DC power supply 20p is applied to the electrode of the electrostatic chuck 20, an electrostatic attraction is generated between the electrostatic chuck 20 and the substrate W. Due to the generated electrostatic attraction, the substrate W is attracted to the electrostatic chuck 20 and held by the electrostatic chuck 20.

A focus ring FR is arranged on the peripheral portion of the support 14 to surround the edge of the substrate W. The focus ring FR is provided to improve the in-plane uniformity of the plasma processing on the substrate W. The focus ring FR may be formed of, but not limited to, silicon, silicon carbide, or quartz.

A flow path 18f is formed in the lower electrode 18. A temperature controlled medium (e.g., a coolant) is supplied to the flow path 18f from a chiller unit 22 provided outside the chamber 10 via a pipe 22a. The chiller unit 22 is provided outside the chamber 10. The temperature controlled medium supplied to the flow path 18f is returned to the chiller unit 22 via a pipe 22b. In the plasma processing apparatus 1, the temperature of the substrate W placed on the electrostatic chuck 20 is adjusted by heat exchange between the temperature controlled medium and the lower electrode 18.

A gas supply line 24 is provided in the plasma processing apparatus 1. The gas supply line 24 supplies a heat transfer gas (e.g., He gas) between the upper surface of the electrostatic chuck 20 and the back surface of the substrate W. The heat transfer gas is supplied to the gas supply line 24 from the heat transfer gas supply mechanism.

The plasma processing apparatus 1 further includes an upper electrode 30. The upper electrode 30 is provided above the support 14. The upper electrode 30 is supported on the upper portion of the chamber body 12 via a member 32. The member 32 is made of an insulating material. The upper electrode 30 and the member 32 close the upper opening of the chamber body 12.

The upper electrode 30 may include a top plate 34 and a support body 36. The lower surface of the top plate 34 is the lower surface on the side of the internal space 10s and defines the internal space 10s. The top plate 34 is formed of a silicon-containing material. The top plate 34 is made of, for example, silicon or silicon carbide. A plurality of gas discharge holes 34a is formed in the top plate 34. The plurality of gas discharge holes 34a penetrate the top plate 34 in the plate thickness direction.

The support body 36 detachably supports the top plate 34. The support body 36 is formed of a conductive material such as aluminum. A gas diffusion chamber 36a is provided inside the support body 36. A plurality of gas holes 34a is formed in the support body 36. The plurality of gas holes 36b extend downward from the gas diffusion chamber 36a. The plurality of gas holes 36b communicate with the plurality of gas discharge holes 34a, respectively. A gas introduction port 36c is formed in the support body 36. The gas introduction port 36c is connected to the gas diffusion chamber 36a. A gas supply pipe 38 is connected to the gas introduction port 36c.

A gas source group 40 is connected to the gas supply pipe 38 via a valve group 41, a flow rate controller group 43, and a valve group 43. The gas source group 40, the valve group 41, the flow rate controller group 42, and the valve group 43 constitute a gas supply GS. The gas source group 40 includes a plurality of gas sources. The gas sources of the gas source group 40 include the gas sources utilized in the method MT. Each of the valve group 41 and the valve group 43 includes a plurality of open/close valves. The flow rate controller group 42 includes a plurality of flow rate controllers. Each of the plurality of flow rate controllers in the flow rate controller group 42 is a mass flow controller or a pressure control type flow rate controller. Each of the plurality of gas sources in the gas source group 40 is connected to the gas supply pipe 38 via a corresponding open/close valve of the valve group 41, a corresponding flow rate controller of the flow rate controller group 42, and a corresponding open/close valve of the valve group 43.

In the plasma processing apparatus 1, a shield 46 is detachably provided along the inner wall surface of the chamber body 12. The shield 46 is provided in the outer periphery of the support portion 13 as well. The shield 46 prevents the by-product of the plasma processing from adhering to the chamber body 12. The shield 46 is constituted by forming a film having corrosion resistance on the surface of a member made of, for example, aluminum. The film having corrosion resistance may be a film formed of a ceramic such as yttrium oxide.

A baffle plate 48 is provided between the support portion 13 and the side wall of the chamber body 12. The baffle plate 48 is constituted by forming a film having corrosion resistance on the surface of a member formed of, for example, aluminum. The film having corrosion resistance may be a film formed of a ceramic such as yttrium oxide. A plurality of through holes is formed in the baffle plate 48. An exhaust port 12e is provided below the baffle plate 48 and at the bottom of the chamber body 12. An exhaust port 12e is connected to an exhaust device 50 via an exhaust pipe 52. The exhaust device 50 has a vacuum pump such as a pressure control valve or a turbo molecular pump.

The plasma processing apparatus 1 further includes a first radio-frequency power supply 62 and a second radio-frequency power supply 64. The first radio-frequency power supply 62 is a power supply that generates a first radio-frequency power. The first radio-frequency power has, for example, a frequency suitable for plasma generation. The frequency of the first radio-frequency power is within the range of, for example, 27 MHz to 100 MHz. The first radio-frequency power supply 62 is connected to the upper electrode 30 via a matching device 66. The matching device 66 includes a circuit that matches the output impedance of the first radio-frequency power supply 62 and the input impedance of the load side (the upper electrode 30 side). The first radio-frequency power supply 62 may be connected to the lower electrode 18 via the matching device 66.

The second radio-frequency power supply 64 is a power supply that generates a second radio-frequency power. The second radio-frequency power has a frequency lower than a frequency of the first radio-frequency power. The second radio-frequency power may be used as a bias radio-frequency power for attracting ions to the substrate W. The frequency of the second radio-frequency power is within the range of, for example, 400 kHz to 40 MHz. The second radio-frequency power supply 64 is connected to the lower electrode 18 via the matching device 68 and the electrode plate 16. The matching device 68 includes a circuit that matches the output impedance of the second radio-frequency power supply 64 and the impedance of the load side (the lower electrode 18 side).

The plasma processing apparatus 1 further includes a bias power supply 70. The bias power supply 70 is configured to apply a negative bias voltage to the upper electrode 30. In an example, the bias power supply 70 is configured to apply a negative DC bias voltage to the upper electrode 30. In another example, the bias power supply 70 is configured to apply a negative AC bias voltage to the upper electrode 30. The frequency of the AC bias voltage generated by the bias power supply 70 is 2 MHz or less. The frequency of the AC bias voltage generated by the bias power supply 70 may be 100 kHz or less.

The plasma processing apparatus 1 further includes a controller 80. The controller 80 may be a computer including a processor, a storage such as a memory, an input device, a display device, and a signal input/output interface. The controller 80 controls each part of the plasma processing apparatus 1. In the controller 80, an operator may use the input device to input a command to manage the plasma processing apparatus 1. Further, in the controller 80, the display device may visualize and display the operating status of the plasma processing apparatus 1. In addition, the storage of the controller 80 stores a control program and recipe data. The control program is executed by the processor of the controller 80 to execute various processes in the plasma processing apparatus 1. The method MT is executed by the plasma processing apparatus 1 by the processor of the controller 80 executing the control program and controlling each part of the plasma processing apparatus 1 according to the recipe data.

Referring back to FIG. 1, the method MT will be described in detail. In the following description, the method MT will be described by taking the case where the method MT is applied to the substrate W using the plasma processing apparatus 1 as an example. Further, in the following description, control of each part of the plasma processing apparatus 1 by the controller 80 will also be described in detail.

In method MT, the substrate W is placed on the support 14 of the plasma processing apparatus 1, that is, the electrostatic chuck 20. The substrate W is held by the electrostatic chuck 20. The steps ST1 and ST2 of the method MT are executed in a state where the substrate W is placed on the support 14. In an embodiment, the substrate W is continuously accommodated in the decompressed internal space 10s of the chamber 10 at least from the start time of the step ST2 to the end time of the step ST3. In another embodiment, the substrate W is continuously accommodated in the decompressed internal space 10s of the chamber 10 at least from the start time of the step ST1 to the end time of the step ST5.

In the step ST1, the inert gas is supplied into the chamber 10, that is, the internal space 10s. The inert gas includes, for example, a rare gas. The rare gas may include any of He, Ne, Ar, Kr, and Xe. The inert gas may further include hydrogen gas ($H_2$ gas). In the step ST1, the gas supply GS is controlled by the controller 80 to supply the inert gas into the chamber 10. Further, in the step ST1, the exhaust device 50 is controlled by the controller 80 to set the pressure in the chamber 10 to the designated pressure. The supply of the inert gas and the setting of the pressure started in the step ST1 may be maintained until the end of the step ST2.

In the step ST2, depositing the silicon-containing material on the substrate W is performed. In the step ST2, one of supplying the first radio-frequency power from the first radio-frequency power supply 62 to the upper electrode 30 and supplying the second radio-frequency power from the second radio-frequency power supply 64 to the lower electrode 18 is selectively performed. Under the first selection, in the step ST2, the first radio-frequency power is supplied from the first radio-frequency power supply 62 to the upper electrode 30, and the supply of the second radio-frequency power to the lower electrode 18 is stopped. Further, under the first selection, in the step ST2, the first radio-frequency power may be supplied from the first radio-frequency power supply 62 to the lower electrode 18, and the supply of the second radio-frequency power to the lower electrode 18 may be stopped. Under the second selection, in the step ST2, the supply of the first radio-frequency power to the upper electrode 30 is stopped, and the second radio-frequency power is supplied from the second radio-frequency power supply 64 to the lower electrode 18. In addition, in the step ST2, a negative bias voltage is applied from the bias power supply 70 to the upper electrode 30.

In the step ST2, the first radio-frequency power supply 62 and the second radio-frequency power supply 64 are controlled by the controller 80 such that one of supplying the first radio-frequency power to the upper electrode 30 and supplying the second radio-frequency power to the lower electrode 18 is selectively performed. Further, in the step ST2, the bias power supply 70 is controlled by the controller 80 to apply a negative bias voltage to the upper electrode 30.

In either case of the first selection and the second selection, in the step ST2, the inert gas is excited in the chamber 10 by a radio-frequency electric field based on the radio-frequency power. As a result, plasma is generated from the inert gas in the chamber 10. Further, by applying a negative bias voltage to the upper electrode 30, positive ions from the plasma collide with the upper electrode 30. When the positive ions collide with the upper electrode 30, the silicon-containing material is released from the upper electrode 30 (top plate 34). The released silicon-containing material is deposited on the substrate W, and a deposited film DP is formed, as illustrated in FIGS. 4A, 4B, and 4C or FIGS. 5A, 5B, and 5C.

Figure 4A:
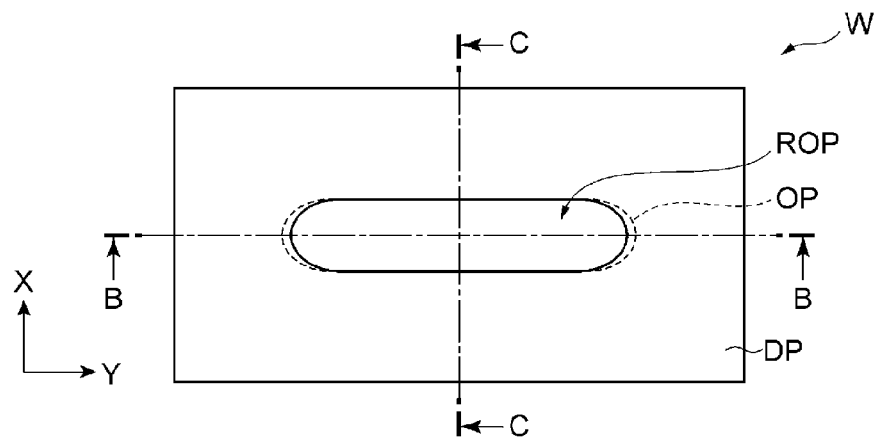
FIG. 4A is a plan view illustrating a part of an example substrate after the execution of a step ST2.
Figure 4B:
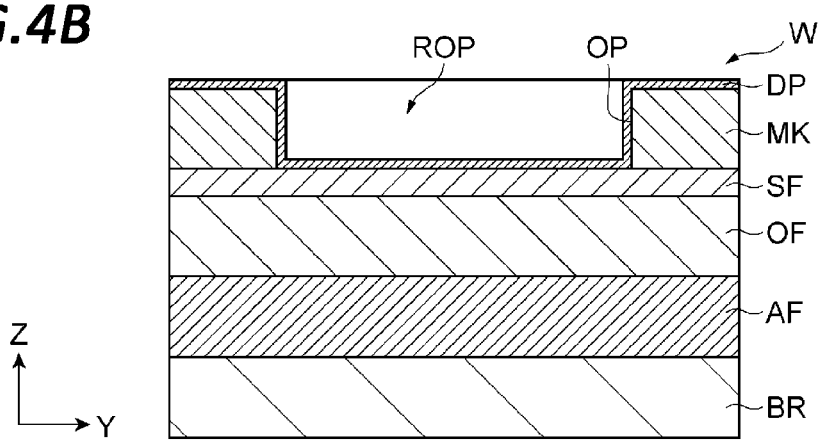
FIG. 4B is a cross-sectional view taken along line B-B of FIG. 4A.
Figure 4C:
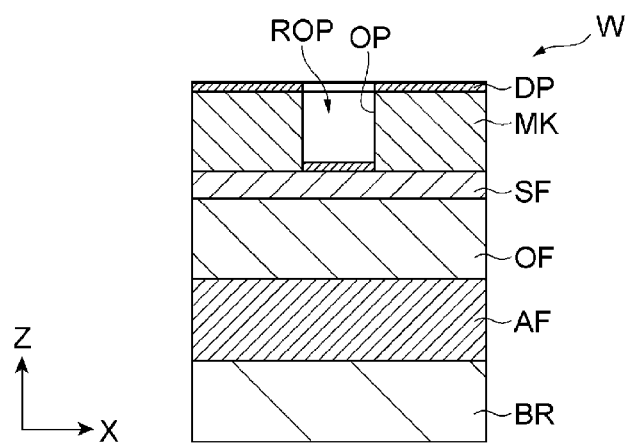
FIG. 4C is a cross-sectional view taken along line C-C of FIG. 4A.

When the step ST2 is performed under the first selection, as illustrated in FIGS. 4A, 4B, and 4C, the silicon-containing material is deposited on the upper surface of the mask MK and the upper surface of the silicon-containing film SF to form a deposited film DP. Further, when the step ST2 is performed under the first selection, the silicon-containing material is selectively deposited on both edges in the longitudinal direction (Y direction) of the side wall surface defining the opening OP to form the deposited film DP. As a result, the width of the opening OP is reduced in the longitudinal direction, and a reduced opening ROP is generated.

Figure 5A:
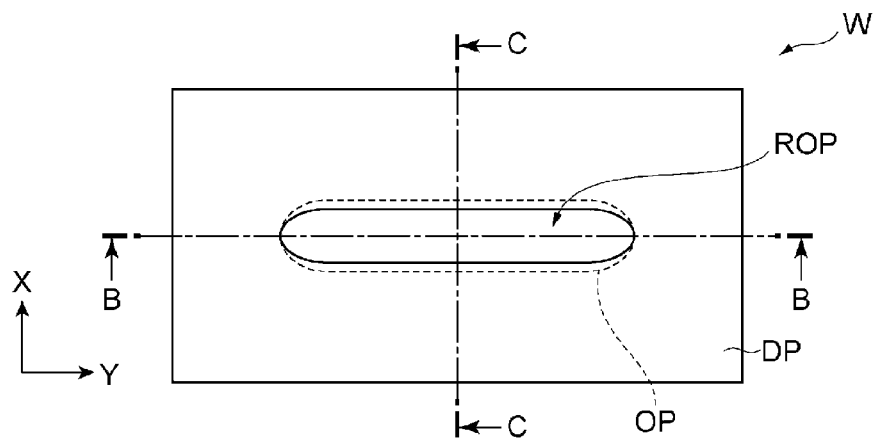
FIG. 5A is a plan view illustrating a part of an example substrate after the execution of a step ST2.
Figure 5B:
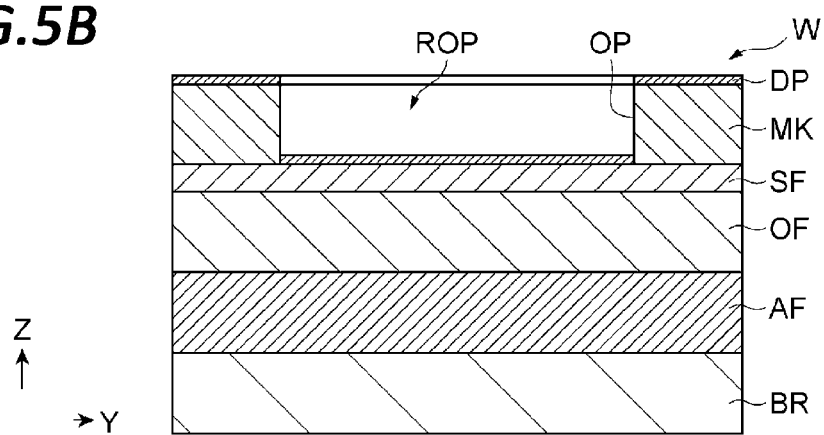
FIG. 5B is a cross-sectional view taken along line B-B of FIG. 5A.
Figure 5C:
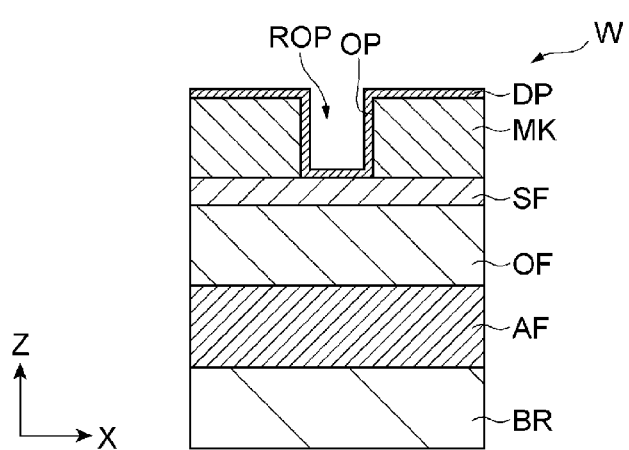
FIG. 5C is a cross-sectional view taken along line C-C of FIG. 5A.

When the step ST2 is performed under the second selection, as illustrated in FIGS. 5A, 5B, and 5C, the silicon-containing material is deposited on the upper surface of the mask MK and the upper surface of the silicon-containing film SF to form a deposited film DP. Further, when the step ST2 is performed under the second selection, the silicon-containing material is selectively deposited on both edges in the X direction of the side wall surface defining the opening OP to form the deposited film DP. As a result, the width of the opening OP is reduced in the X direction, and a reduced opening ROP is generated.

In the subsequent step ST3, a plasma etching is performed on the silicon-containing film SF. In the step ST3, plasma is formed from the processing gas in the chamber 10. The processing gas contains a fluorocarbon gas. In the step ST3, the silicon-containing film SF is etched by the chemical species from the plasma. In the step ST3, the gas supply GS is controlled by the controller 80 to supply the processing gas into the chamber 10. Further, in the step ST3, the exhaust device 50 is controlled by the controller 80 to set the pressure in the chamber 10 to the designated pressure. In the step ST3, the first radio-frequency power supply 62 and/or the second radio-frequency power supply 64 are controlled by the controller 80 to supply the first radio-frequency power and/or the second radio-frequency power.

In the step ST3, a step of depositing fluorocarbon chemical species from the plasma formed from the processing gas on the substrate W and a step of irradiating the substrate W with ions from the plasma of the rare gas may be repeated alternately. In this case, when the substrate W is irradiated with ions from the plasma of the rare gas, the fluorocarbon chemical species on the substrate W react with the silicon-containing film SF. As a result, the silicon-containing film SF is etched.

Figure 6A:
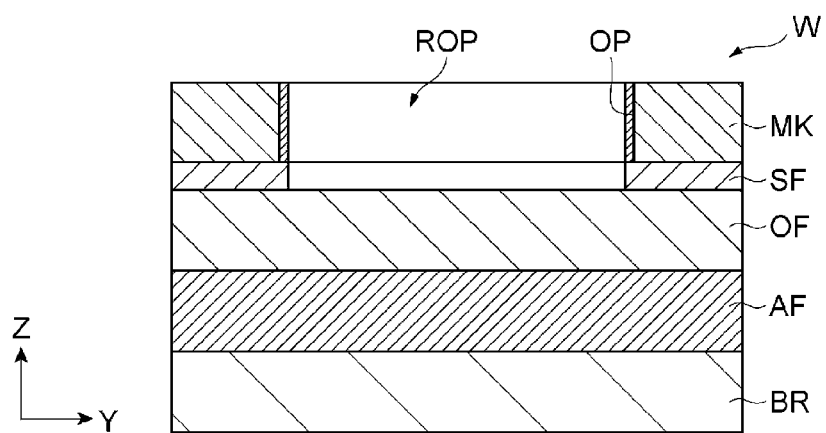
FIG. 6A is a cross-sectional view illustrating an example substrate after the execution of a step ST3.
Figure 6B:
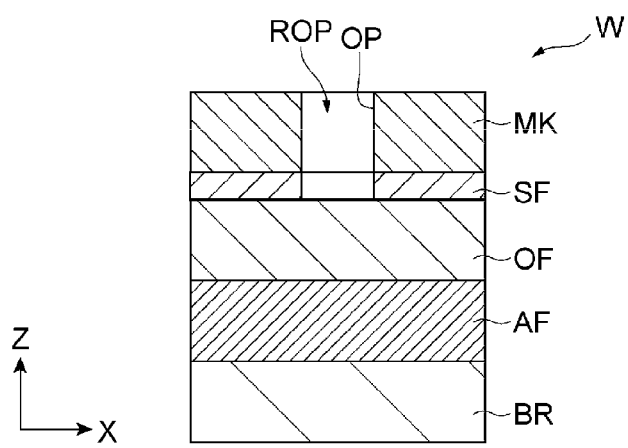
FIG. 6B is a cross-sectional view illustrating an example substrate after the execution of the step ST3.
Figure 7A:
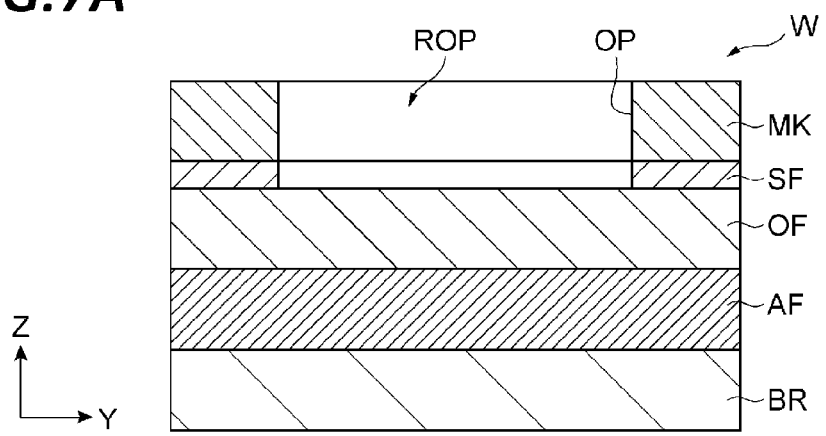
FIG. 7A is a cross-sectional view illustrating the example substrate after the execution of the step ST3.
Figure 7B:
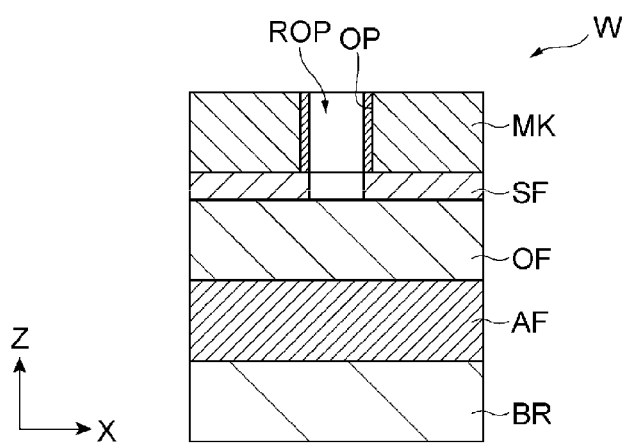
FIG. 7B is another cross-sectional view illustrating the example substrate after the execution of the step ST3.

When the step ST2 is executed under the first selection, in the step ST3, as illustrated in FIGS. 6A and 6B, the silicon-containing film SF is etched in a portion exposed from the opening ROP reduced in the longitudinal direction (Y direction). When the step ST2 is executed under the second selection, in the step ST3, as illustrated in FIGS. 7A and 7B, the silicon-containing film SF is etched in a portion exposed from the opening ROP reduced in the X direction.

In the subsequent step ST4, a plasma etching is performed on the organic film OF. In the step ST4, a plasma is formed from the processing gas in the chamber 10. The processing gas contains, for example, an oxygen-containing gas. The oxygen-containing gas may be $O_2$ gas. Alternatively, the processing gas may be a mixed gas of nitrogen gas and hydrogen gas. In the step ST4, the gas supply GS is controlled by the controller 80 to supply the processing gas into the chamber 10. Further, in the step ST4, the exhaust device 50 is controlled by the controller 80 to set the pressure in the chamber 10 to the designated pressure. In the step ST4, the first radio-frequency power supply 62 and/or the second radio-frequency power supply 64 are controlled by the controller 80 to supply the first radio-frequency power and/or the second radio-frequency power.

Figure 8A:
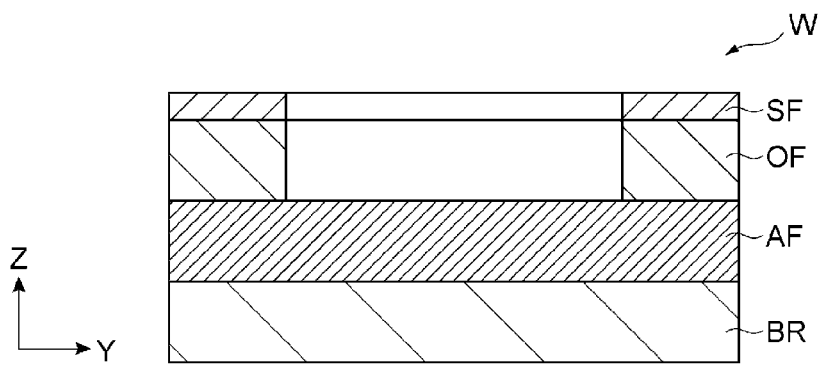
FIG. 8A is a cross-sectional view illustrating an example substrate after the execution of a step ST4.
Figure 8B:
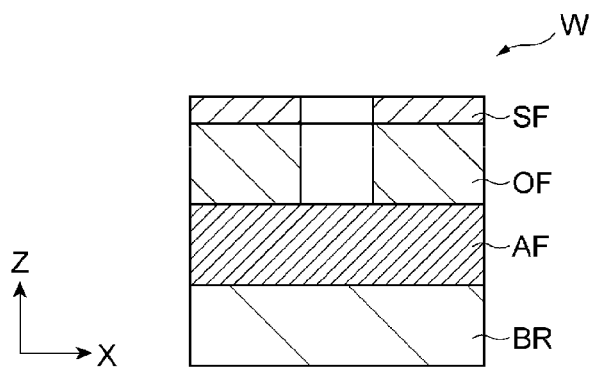
FIG. 8B is another cross-sectional view illustrating the example substrate after the execution of the step ST4.
Figure 9A:
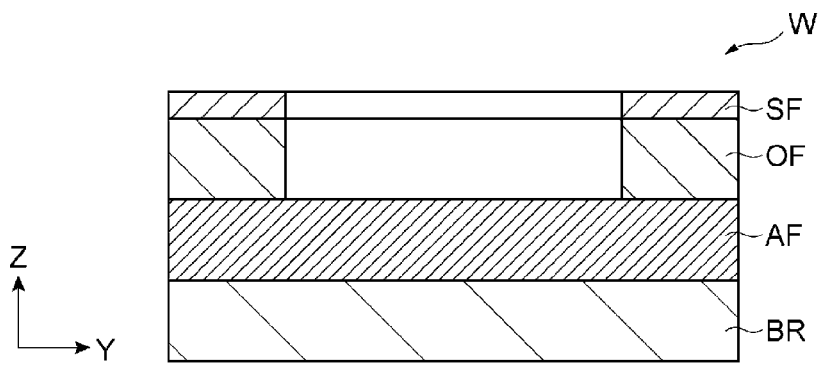
FIG. 9A is a cross-sectional view illustrating an example substrate after the execution of the step ST4.
Figure 9B:
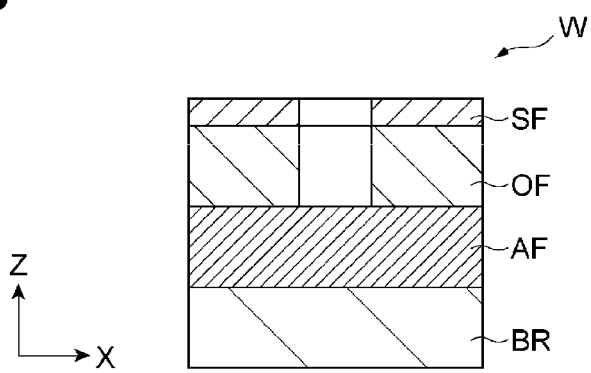
FIG. 9B is another cross-sectional view illustrating the example substrate after the execution of the step ST4.

In the step ST4, the organic film OF is etched by the chemical species from the plasma formed from the processing gas. In the step ST4, the mask MK is also etched. When the step ST4 is performed on the substrate W illustrated in FIGS. 6A and 6B, the pattern of the silicon-containing film SF of the substrate W is transferred to the organic film OF, as illustrated in FIGS. 8A and 8B. When the step ST4 is performed on the substrate W illustrated in FIGS. 7A and 7B, the pattern of the silicon-containing film SF of the substrate W is transferred to the organic film OF, as illustrated in FIGS. 9A and 9B.

In the subsequent step ST5, a plasma etching is performed on the film AF. In the step ST5, a plasma is formed from the processing gas in the chamber 10. The processing gas may be a gas containing a halogen element when the film AF is a silicon-containing film. In the step ST5, the gas supply GS is controlled by the controller 80 to supply the processing gas into the chamber 10. Further, in the step ST5, the exhaust device 50 is controlled by the controller 80 to set the pressure in the chamber 10 to the designated pressure. In the step ST5, the first radio-frequency power supply 62 and/or the second radio-frequency power supply 64 are controlled by the controller 80 to supply the first radio-frequency power and/or the second radio-frequency power.

Figure 10A:
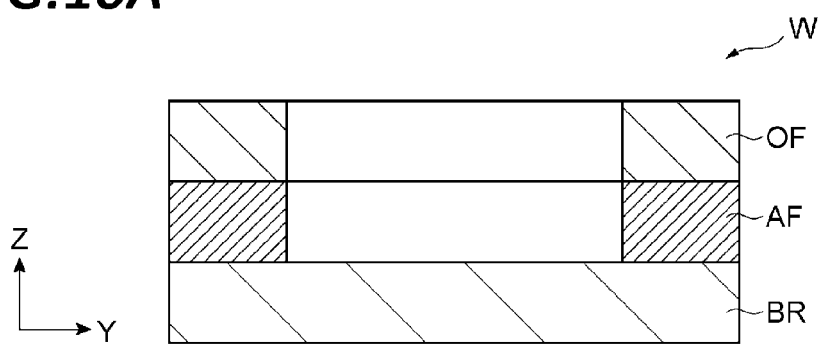
FIG. 10A is a cross-sectional view illustrating an example substrate after the execution of a step ST5.
Figure 10B:
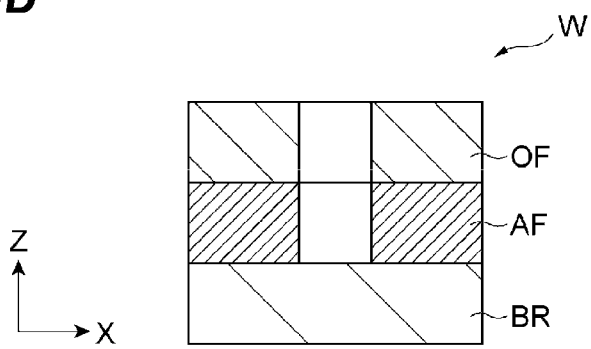
FIG. 10B is another cross-sectional view illustrating the example substrate after the execution of the step ST5.
Figure 11A:
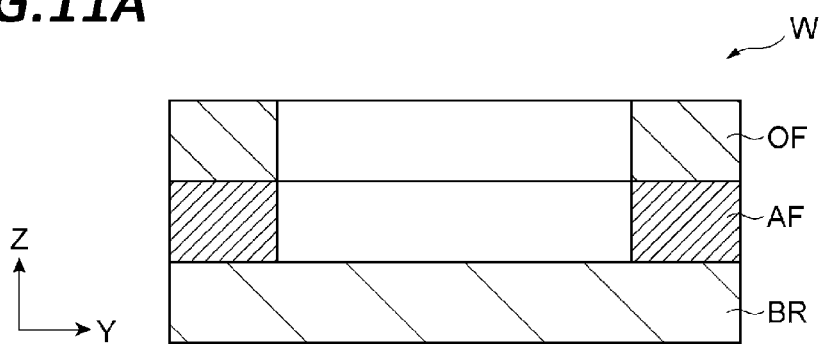
FIG. 11A is a cross-sectional view illustrating the example substrate after the execution of the step ST5.
Figure 11B:
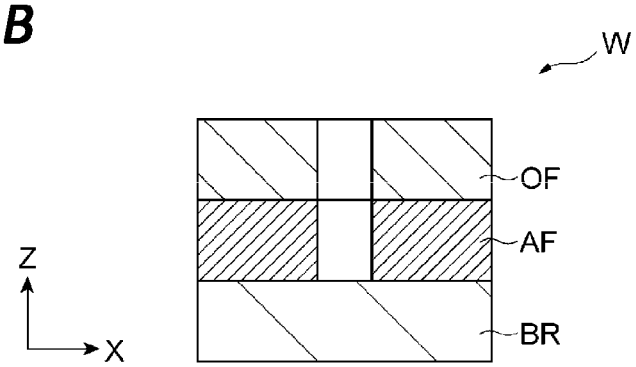
FIG. 11B is another cross-sectional view illustrating the example substrate after the execution of the step ST5.

In the step ST5, the film AF is etched by the chemical species from the plasma formed from the processing gas. In the step ST5, the silicon-containing film SF is also etched. When the step ST5 is performed on the substrate W illustrated in FIGS. 8A and 8B, the pattern of the organic film OF of the substrate W is transferred to the film AF, as illustrated in FIGS. 10A and 10B. When the step ST5 is performed on the substrate W illustrated in FIGS. 9A and 9B, the pattern of the organic film OF of the substrate W is transferred to the film AF, as illustrated in FIGS. 11A and 11B.

As described above, in the step ST2, when a negative bias voltage is applied to the upper electrode 30 in a state where the first radio-frequency power is being supplied to the upper electrode 30, the width of the opening OP of the mask MK in the longitudinal direction (Y direction) is selectively reduced by the silicon-containing material. Meanwhile, in the step ST2, when a negative bias voltage is applied to the upper electrode 30 in a state where the second radio-frequency power is being supplied to the lower electrode 18, the width of the opening OP of the mask MK in the X direction is selectively reduced by the silicon-containing material.

Although various embodiments have been described above, the present disclosure is not limited to the embodiments described above, and various omissions, substitutions, and changes may be made. In addition, it is possible to combine the elements in different embodiments to form other embodiments.

Hereinafter, descriptions will be made on the experiment performed to evaluate the method MT. The present disclosure is not limited to the following experiment.

Figure 12A:
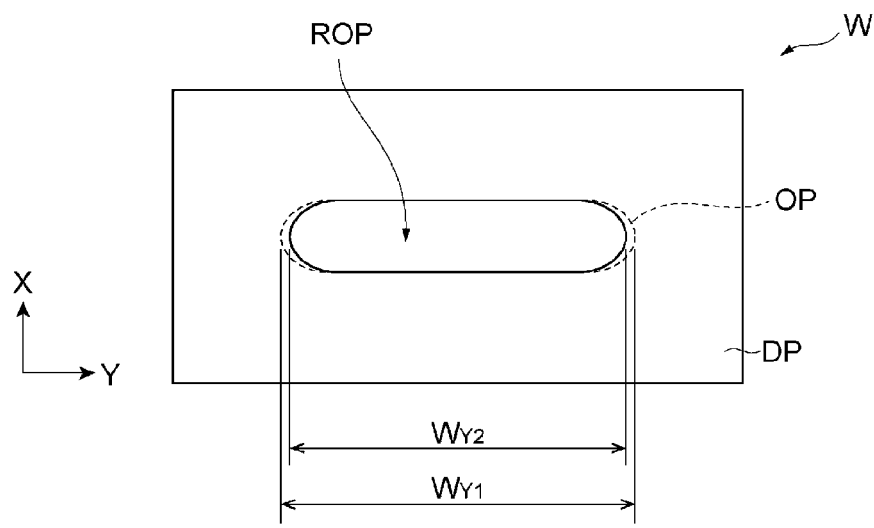
FIGS. 12A and 12B are views illustrating measured values obtained in an experiment.
Figure 12B:
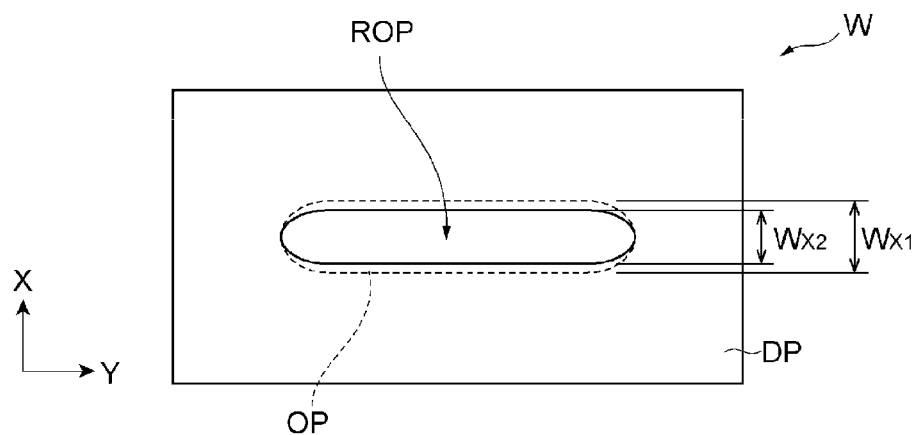

In the experiment, two sample substrates having a mask on the silicon-containing film are prepared. In each of the two sample substrates, the mask is a resist mask. The opening OP is formed in the mask. The width $W_{Y1}$ in the longitudinal direction (Y direction) and the width $W_{X1}$ in the X direction (see, e.g., FIG. 12A and FIG. 12B) of the opening OP are 369.1 nm and 53.9 nm, respectively. For the first sample substrate of the two sample substrates, the step ST2 is performed using the plasma processing apparatus 1 under the first selection. For the second sample substrate of the two sample substrates, the step ST2 is performed using the plasma processing apparatus 1 under the second selection. The conditions of the step ST2 in the experiment are described below.

<Condition of the Step ST2 for the First Sample Substrate>
Pressure in the chamber 10: 50 mT (6.666 Pa)
Flow rate of $H_2$ gas: 100 sccm
Flow rate of Ar gas: 760 sccm
First radio-frequency power: 60 MHz, 300 W
Second radio-frequency power: 40 MHz, 0 W
<Condition of the Step ST2 for the Second Sample Substrate>
Pressure in the chamber 10: 50 mT (6.666 Pa)
Flow rate of $H_2$ gas: 100 sccm
Flow rate of Ar gas: 760 sccm
First radio-frequency power: 60 MHz, 0 W
Second radio-frequency power: 40 MHz, 300 W In the experiment, for each of the first sample substrate and the second sample substrate, the width $W_{Y2}$ in the longitudinal direction (Y direction) and the width $W_{X2}$ in the X direction of the reduced opening ROP after the execution of the step ST2 are measured. Then, $\Delta W_Y = W_{Y1} - W_{Y2}$ and $\Delta W_X = W_{X1} - W_{X2}$ are obtained for each of the first sample substrate and the second sample substrate. As a result, $\Delta W_Y$ and $\Delta W_X$ relating to the first sample substrate are 4.5 nm and 0.7 nm, respectively. Further, $\Delta W_Y$ and $\Delta W_X$ relating to the second sample substrate are 0.5 nm and 9.4 nm, respectively. As a result of the experiment, in the step ST2, when the first radio-frequency power is supplied to the upper electrode 30 and the supply of the second radio-frequency power to the lower electrode 18 is stopped, it has been confirmed that the width of the opening OP may be selectively reduced in the longitudinal direction. Further, in the step ST2, when the supply of the first radio-frequency power to the upper electrode 30 is stopped and the second radio-frequency power is supplied to the lower electrode 18, it has been confirmed that the width of the opening OP may be selectively reduced in the longitudinal direction.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

DESCRIPTION OF SYMBOLS

1: plasma processing apparatus
10: chamber
14: support
18: lower electrode
30: upper electrode
62: first radio-frequency power supply
64: second radio-frequency power supply
70: bias power supply
W: substrate
MK: mask
OP: opening
SF: silicon-containing film

What is claimed is:

1. A method for a plasma processing, comprising:
placing a substrate on a substrate support provided in a chamber of a capacitively coupled plasma processing apparatus including a lower electrode where the substrate support is provided, an upper electrode including silicon, a first radio-frequency power supply, a second radio-frequency power supply, and a bias power supply, the substrate including a silicon-containing film and a mask provided on the silicon-containing film, the mask having an opening having a longitudinal direction;
selecting a narrowing of the opening either in a first direction or in a second direction, wherein the first direction is different than the second direction,
in response to selection of narrowing in the first direction performing a first process selection, and in response to selection of narrowing in the second direction performing a second process selection; and
in each of the first process selection and the second process selection, an inert gas is supplied to the chamber and a plasma is formed in the chamber, and further a negative bias voltage is applied to the upper electrode to cause positive ions from the plasma to collide with the upper electrode and release silicon from the upper electrode, thereby depositing a silicon-containing material on the substrate;
wherein the first process selection further includes applying the first radio-frequency power from the first radio-frequency power supply to the upper electrode and supply of the second radio-frequency from the second radio-frequency power supply to the lower electrode is stopped, and the silicon-containing material is deposited on sidewalls of the mask to narrow the opening by an amount greater in the first direction than in the second direction, and wherein the second process selection further includes applying the second radio-frequency power from the second radio frequency power supply to the lower electrode and supply of the first radio-frequency power supply from the first radio-frequency power supply to the upper electrode is stopped, and the silicon-containing material is deposited on sidewalls of the mask to narrow the opening by an amount greater in the second direction than in the first direction.

2. The method according to claim 1, wherein the negative bias voltage is a DC voltage.

3. The method according to claim 1, wherein the upper electrode is made of silicon or silicon carbide.

4. The method according to claim 1, further comprising: performing a plasma etching on a base film of the mask after the depositing of the silicon-containing material.

5. The method according to claim 4, wherein the substrate is continuously accommodated in a decompressed internal space of the chamber at least in a period from a start of the depositing of the silicon-containing material to an end of the performing of the plasma etching.

6. The method according to claim 4, the performing the plasma etching on the base film includes:
   depositing fluorocarbon chemical species on the substrate; and
   irradiating the substrate with ions from the plasma of the rare gas.

7. The method according to claim 1, wherein, in the supplying the inert gas into the chamber, hydrogen gas is further supplied into the chamber in addition to the inert gas.

8. The method according to claim 1, wherein, in the depositing the silicon-containing material on the substrate, the silicon-containing material is selectively deposited on both edges in a longitudinal direction of a side wall surface defining the opening.

9. The method according to claim 1, wherein, in the depositing the silicon-containing material on the substrate, the silicon-containing material is selectively deposited on both edges in a direction orthogonal to the longitudinal direction of the side wall surface defining the opening.

10. The etching method of claim 1, wherein the first process selection and the second process selection each provide a modified opening in the mask;
   the method further including etching the silicon-containing film through the modified opening to form an opening in the silicon-containing film.

11. The etching method of claim 10, wherein the substrate includes an organic film beneath the silicon-containing film;
the method further including etching the organic film through the opening in the silicon-containing film.

12. The etching method of claim 11, wherein the etching of the organic film includes transferring a pattern of the silicon-containing film to the organic film to form a pattern in the organic film, and during the etching of the organic film the mask is also etched;
   the method further including, after etching of the organic film, etching an anti-reflection film through the pattern of the organic film.

13. The etching method of claim 1, wherein the inert gas includes at least one rare gas selected from the group consisting of: He, Ne, Ar, Kr, and Xe.

14. A method for a plasma processing, comprising:
   placing a substrate on a substrate support provided in a chamber of a capacitively coupled plasma processing apparatus including a lower electrode where the substrate support is provided, an upper electrode including silicon, a first radio-frequency power supply connected to the upper electrode, a second radio-frequency power supply connected to the lower electrode, and a bias power supply, the substrate including a silicon-containing film and a mask provided on the silicon-containing film, the mask having an opening having a longitudinal direction and a width direction orthogonal to the longitudinal direction;
   supplying an inert gas into the chamber; and
   supplying a second radio-frequency power having a frequency lower than a frequency of a first radio-frequency power generated by the first radio-frequency power supply from the second radio-frequency power supply to the lower electrode of the substrate support to generate plasma from the inert gas while a supply of the first radio frequency to the upper electrode is stopped, and applying a negative bias voltage to the upper electrode from the bias power supply to cause positive ions from the plasma to collide with the upper electrode and release silicon from the upper electrode, and depositing a silicon-containing material on sidewalls of the opening of the mask to reduce the opening of the mask with a reduction amount in the longitudinal direction being larger than a reduction amount in the width direction.

15. The method according to claim 14, wherein the negative bias voltage is a DC voltage.

16. The method according to claim 14, further comprising:
   performing a plasma etching on a base film of the mask after the depositing of the silicon-containing material.

17. The method according to claim 16, wherein the substrate is continuously accommodated in a decompressed internal space of the chamber at least in a period from a start of the depositing of the silicon-containing material to an end of the performing of the plasma etching.

* * * * *